(12) United States Patent
Chawla

(10) Patent No.: US 10,484,791 B2
(45) Date of Patent: *Nov. 19, 2019

(54) AMPLIFIER SPEAKER DRIVE CURRENT SENSE

(71) Applicant: TEXAS INSTRUMENTS INCORPORATED, Dallas, TX (US)

(72) Inventor: Mohit Chawla, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/218,615

(22) Filed: Dec. 13, 2018

(65) Prior Publication Data

US 2019/0116420 A1    Apr. 18, 2019

Related U.S. Application Data

(63) Continuation of application No. 15/395,106, filed on Dec. 30, 2016, now Pat. No. 10,206,037.

(30) Foreign Application Priority Data

Jul. 6, 2016    (IN) .............................. 201641023194

(51) Int. Cl.
*H03F 3/217* (2006.01)
*H04R 3/00* (2006.01)
(Continued)

(52) U.S. Cl.
CPC ............. *H04R 3/007* (2013.01); *H03F 3/187* (2013.01); *H03F 3/2171* (2013.01);
(Continued)

(58) Field of Classification Search
CPC ....... H04R 3/007; H04R 29/001; H03F 3/187; H03F 3/2171; H03F 3/2173;
(Continued)

(56) References Cited

U.S. PATENT DOCUMENTS

2002/0159532 A1* 10/2002 Wight ...................... H03C 3/40
375/260
2006/0022752 A1    2/2006 Akiyama et al.
(Continued)

*Primary Examiner* — Vivian C Chin
*Assistant Examiner* — Con P Tran
(74) *Attorney, Agent, or Firm* — John R. Pessetto; Charles A. Brill; Frank D. Cimino

(57) ABSTRACT

A class-D amplifier includes measurement of speaker current via the low-side drive transistors of the amplifier. In one embodiment, a class-D amplifier includes two high-side transistors, two low-side transistors, a first sense resistor, a second sense resistor, and a sigma delta analog to digital converter (ΣΔ ADC). The two high-side transistors and two low-side transistors are connected as a bridge to drive a bridge tied speaker. The first sense resistor is connected between a first of the low-side transistors and a low-side reference voltage. The second sense resistor is connected between a second of the low-side transistors and the low-side reference voltage. The ΣΔ ADC is coupled to the bridge to measure voltage across the first sense resistor and the second sense resistor.

10 Claims, 3 Drawing Sheets

(51) Int. Cl.
  *H03M 3/00* (2006.01)
  *H03F 3/187* (2006.01)
  *H03F 3/45* (2006.01)
  *H04R 29/00* (2006.01)

(52) U.S. Cl.
  CPC ......... *H03F 3/2173* (2013.01); *H03F 3/2175* (2013.01); *H03F 3/45475* (2013.01); *H03M 3/464* (2013.01); *H03F 2200/03* (2013.01); *H03F 2200/405* (2013.01); *H03F 2203/45116* (2013.01); *H03F 2203/45546* (2013.01); *H03F 2203/45594* (2013.01); *H03M 3/43* (2013.01); *H03M 3/45* (2013.01); *H03M 3/452* (2013.01); *H04R 29/001* (2013.01)

(58) Field of Classification Search
  CPC ............... H03F 3/2175; H03F 3/45475; H03F 2200/03; H03F 2200/405; H03F 2203/45116; H03F 2203/45546; H03F 2203/45594; H03M 3/464; H03M 3/43; H03M 3/452; H03M 3/45
  USPC ...... 381/55, 120, 123; 330/251, 252, 207 A, 330/51; 341/144; 375/238
  See application file for complete search history.

(56) References Cited

U.S. PATENT DOCUMENTS

| | | |
|---|---|---|
| 2015/0020592 A1 | 1/2015 | Choi et al. |
| 2015/0303885 A1 | 10/2015 | Kinyua et al. |
| 2017/0126187 A1 | 5/2017 | Frith et al. |
| 2017/0131333 A1 | 5/2017 | Schapendonk |
| 2017/0250662 A1 | 8/2017 | Cope et al. |

* cited by examiner

AMPLIFIER SPEAKER DRIVE CURRENT SENSE

CROSS-REFERENCE TO RELATED APPLICATIONS

This continuation application claims priority to U.S. patent application Ser. No. 15/395,106, filed Dec. 30, 2016, which application claims priority to Indian Provisional Patent Application No. 201641023194, filed Jul. 6, 2016, both of which are hereby incorporated herein by reference in their entirety.

BACKGROUND

Class-D audio amplifiers are switch mode amplifiers that switch at a high frequency to produce a rectangular waveform at the amplifier's output. Class-D amplifiers may be much more efficient that linear audio amplifiers, and as a result may employ smaller power supplies and eliminate heat sinks. Accordingly, class-D amplifiers may significantly reduce overall system costs, size, and weight relative to linear amplifiers of equivalent power.

Some class-D amplifiers use a pulse width modulator (PWM) to generate pulses that vary in width with the audio signal's amplitude. The pulses may switch output transistors of the amplifier at a fixed or variable frequency. Some class-D amplifiers may rely upon other types of pulse modulators, such as pulse density modulators. The rectangular waveform generated by the class-D amplifier is filtered to remove the high-frequency carrier waveform and reconstruct the audio waveform, which can be used to drive a speaker and produce sound.

Some class-D amplification systems include circuitry to model and monitor speaker performance. Such systems use the speaker performance information to optimize amplifier output and protect the speaker. These amplification systems may be referred to as "smart amplifiers."

SUMMARY

A class-D amplification system that includes measurement of speaker current via the low-side drive transistors of the amplifier is disclosed herein. In one embodiment, a class-D amplifier includes two high-side transistors, two low-side transistors, a first sense resistor, a second sense resistor, and a sigma delta analog to digital converter ($\Sigma\Delta$ ADC). The two high-side transistors and two low-side transistors are connected as a bridge to drive a bridge tied speaker. The first sense resistor is connected between a first of the low-side transistors and a low-side reference voltage. The second sense resistor is connected between a second of the low-side transistors and the low-side reference voltage. The sigma delta analog to digital converter is coupled to the bridge to measure voltage across the first sense resistor and the second sense resistor.

In another embodiment, a speaker drive and current measurement system includes a transistor bridge and a $\Sigma\Delta$ ADC. The transistor bridge includes two high-side switching transistors, a first low-side switching transistor, a second low-side switching transistor, a first sense resistor, and a second sense resistor. The first sense resistor connects the first low-side switching transistor to a low-side reference voltage. The second sense resistor connects the second low-side switching transistor to the low-side reference voltage. The $\Sigma\Delta$ ADC is coupled to the bridge. The $\Sigma\Delta$ ADC includes a first digital to analog converter (DAC) and a second DAC. The first DAC is dedicated to measurement of voltage across the first sense resistor. The second DAC is dedicated to measurement of voltage across the second sense resistor.

In a further embodiment, an audio amplifier includes a driver and a current monitoring system. The driver is configured to drive a speaker. The current monitoring system is configured to measure the current output by the driver. The driver includes two high-side transistors, two low-side transistors, a first sense resistor, and a second sense resistor. The two high-side transistors and two low-side transistors are connected as a bridge to drive the speaker. The first sense resistor is connected between a first of the low-side transistors and a low-side reference voltage. The second sense resistor is connected between a second of the low-side transistors and the low-side reference voltage. The current monitoring system includes a $\Sigma\Delta$ ADC coupled to the driver to measure voltage across the first sense resistor and the second sense resistor. The $\Sigma\Delta$ ADC includes a differential amplifier, a first switch, a second switch, a first DAC, and a second DAC. The first switch is to switchably connect one of a positive side of the first sense resistor or a negative side of the second sense resistor to a first input of the differential amplifier. The second switch is to switchably connect one of a positive side of the second sense resistor or a negative side of the first sense resistor to a second input of the differential amplifier. The first DAC is dedicated to measurement of voltage across the first sense resistor. The second DAC is dedicated to measurement of voltage across the second sense resistor.

BRIEF DESCRIPTION OF THE DRAWINGS

For a detailed description of various examples, reference will now be made to the accompanying drawings in which.

DETAILED DESCRIPTION

Figure 1:
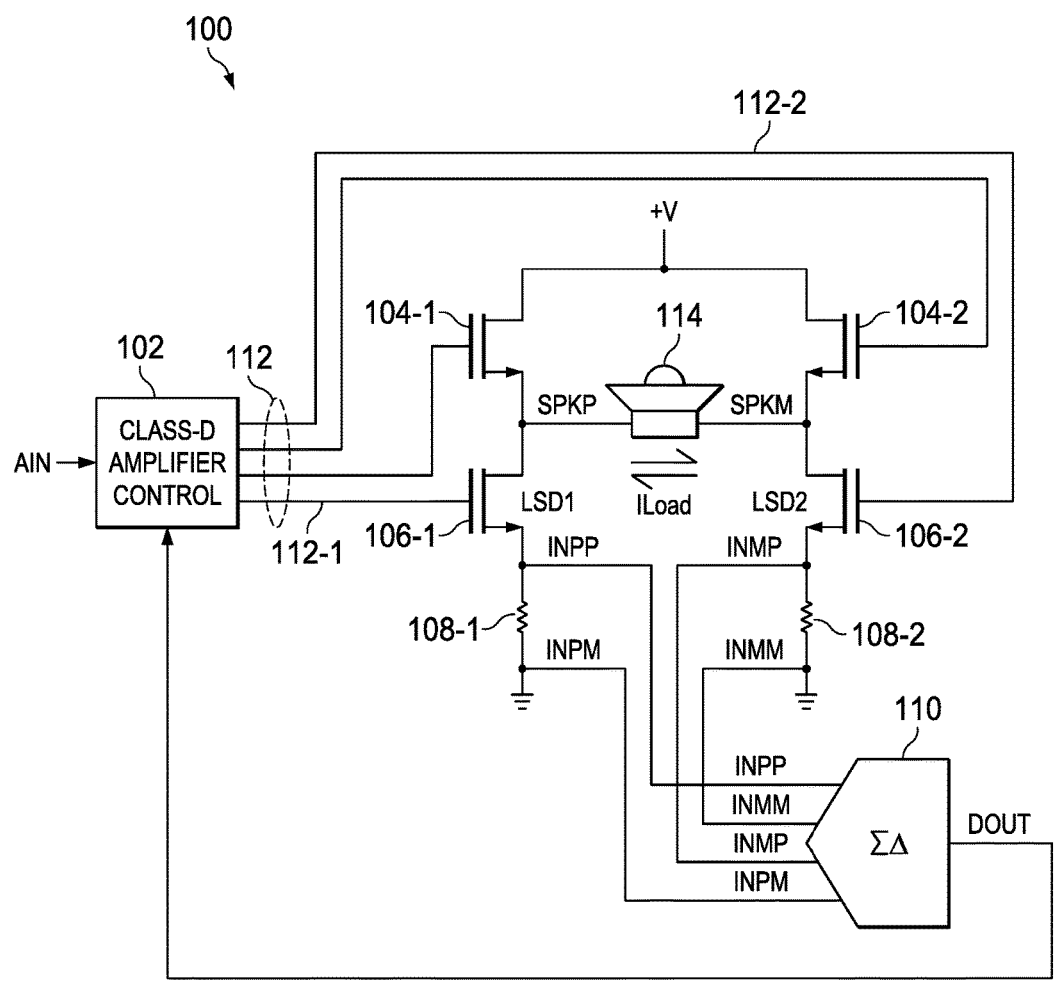
FIG. 1 shows a schematic diagram for a class-D amplification system in accordance with various examples.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Some smart amplifiers measure the current driving the speaker to produce real-time speaker diagnostics. In such amplifiers, the current measurements are used to determine load conditions in real-time, and used in diagnostics that aid in maximizing power delivery to the load and in improving sound pressure level. Unfortunately, the current measurement techniques employed in conventional smart amplifiers are subject to a variety of problems. In some conventional smart amplifiers, sense transistors are added to mirror the currents flowing in the low side drive transistors. The addition of the sense transistors and associated circuitry requires significant circuit area and additional power, and provides limited measurement accuracy because using the sense transistors negative currents cannot be sensed.

Other conventional smart amplifiers insert a sense resistor in series with the speaker, and measure the voltage drop across the sense resistor. Because the signal to common mode swings at the sense resistor can be high (e.g., as high as 1:140, for 14V supply, 50 m Ohms Sense resistor and 2 A peak load), current measurement using a load sense resistor is limited, and when employed may require a floating supply to accommodate common mode variations and analog level shifters, both of which increase circuit area. Moreover, the additional components in the signal path limit achievable accuracy.

Embodiments of the present disclosure provide improved current measurement accuracy with low circuit area. In the amplifier circuit disclosed herein, a sense resistor is inserted between each of the low-side drive transistors and the low-side reference voltage source. A novel sigma-delta analog-to-digital converter (ΣΔ ADC) measures the voltage across the sense resistors to determine the current flowing in the speaker. The ΣΔ ADC includes two digital-to-analog converters (DACs), two sets of input resistors and two sets of integrator feedback capacitors, where one DAC, one set of input resistors and one set of feedback capacitors corresponds to each of the sense resistors. Both DACs are always active to eliminate DAC settling time issues. Switching circuitry in the ΣΔ ADC selects which of the sense resistors to monitor based on the drive transistor gate drive signals. Control circuitry connects a sense resistor coupled to a last activated low-side drive transistor to the ΣΔ ADC. If both low-side drive transistors are activated, the switching circuitry maintains connection of a currently selected sense resistor to the ΣΔ ADC.

FIG. 1 shows a schematic diagram for a class-D amplification system 100 in accordance with various examples. The class-D amplification system 100 includes class-D amplifier control circuitry 102, drive transistors 104 and 106 (illustrated as 104-1, 104-2, 106-1, and 106-2), current sense resistors 108-1 and 108-2 (collectively sense resistors 108), and ΣΔ ADC 110. A speaker 114 is included in FIG. 1 for completeness. The speaker 114 is the load driven by the amplification system 100 and is not part of the amplification system 100.

The class-D amplifier control circuitry 102 receives as input an analog or digital signal AIN. The signal AIN may be an audio signal that is to be amplified for driving the speaker 114. The class-D amplifier control circuitry 102 may include modulation circuitry (e.g., pulse width modulation circuitry), operational amplifiers, filters, comparators, transistor drivers (e.g., metal oxide field effect transistor (MOSFET) gate drivers), and other components and circuits suitable for producing signals to control the drive transistors 104 and 106. The class-D amplifier control circuitry 102 may also include circuitry (e.g., a microcontroller or digital signal processor) that adjusts the signals controlling the drive transistors 104, 106 responsive to the measurement values provided by the ΣΔ ADC 110. For example, current measurements provided by the ΣΔ ADC 110 may be used to determine temperature and/or excursion of the speaker 114, which can be used to optimize speaker drive under working conditions.

The class-D amplifier control circuitry 102 produces the signals 112 that control the activation and deactivation of the drive transistors 104 and 106. The drive transistors 104 and 106 may be power MOSFETs or other transistors. The drive transistors 104 and 106 are connected to form bridge. The drive transistors 104-1 and 104-2 are connected on the high-side of the bridge (i.e., the drive transistors 104-1 and 104-2 are the high-side drive transistors. The drive transistors 106-1 and 106-2 are connected on the low-side of the bridge (i.e., the drive transistors 106-1 and 106-2 are the low-side drive transistors. As shown in FIG. 1, the speaker 114 is connected across the bridge formed by the drive transistors 104 and 106 (i.e., the speaker is bridge-tied). Activation of transistors 104-1 and 106-2 produces current flow through the speaker 114 in a first direction, and activation of transistors 104-2 and 106-1 produces current flow through the speaker 114 in a second direction The sense resistor 108-1 is between the low-side drive transistor 106-1 and the low-side reference voltage source. For example, in the embodiment of FIG. 1, a first terminal (positive side terminal) of the sense resistor 108-1 is connected to the source terminal of the low-side drive transistor 106-1, and a second terminal (negative side terminal) of the sense resistor 108-1 is connected to ground. Similarly, in FIG. 1, a first terminal (positive side terminal) of the sense resistor 108-2 is connected to the source terminal of the low-side drive transistor 106-2, and a second terminal (negative side terminal) of the sense resistor 108-2 is connected to ground.

The class-D amplifier control circuitry 102 controls the drive transistors 104 and 106 for operation in "low-side recycle mode." In low-side recycle mode, at least one of the low-side drive transistors 106 is active (i.e., turned on) at any point in time. Accordingly, embodiments of the class-D amplifier control circuitry 102 can measure current flowing in the low-side drive transistors 106 to measure the current flowing in the speaker 114. The current flowing in the low-side drive transistors 106 also flows through the sense resistors 108. Embodiments of the class-D amplification system 100 measure the voltage drop across the sense resistors 108 to determine the current flowing in the speaker 114.

The ΣΔ ADC 110 is connected to both terminals of each of the sense resistors 108 for measurement of the voltage across each sense resistor 108. Because the current flowing in the speaker 114 changes direction as the two different pairs of drive transistors 104, 106 are switched, the ΣΔ ADC 110 senses current flowing in both of the sense resistors 108 and combines the current sense information. The digital output of the ΣΔ ADC 110 includes a measurement of the current flowing the speaker 114 (as a measurement of voltage across the sense resistors 108), and is provided to the class-D amplifier control circuitry 102 for use in controlling the drive transistors 104 and 106 to optimize operation of the speaker 114.

Figure 2:
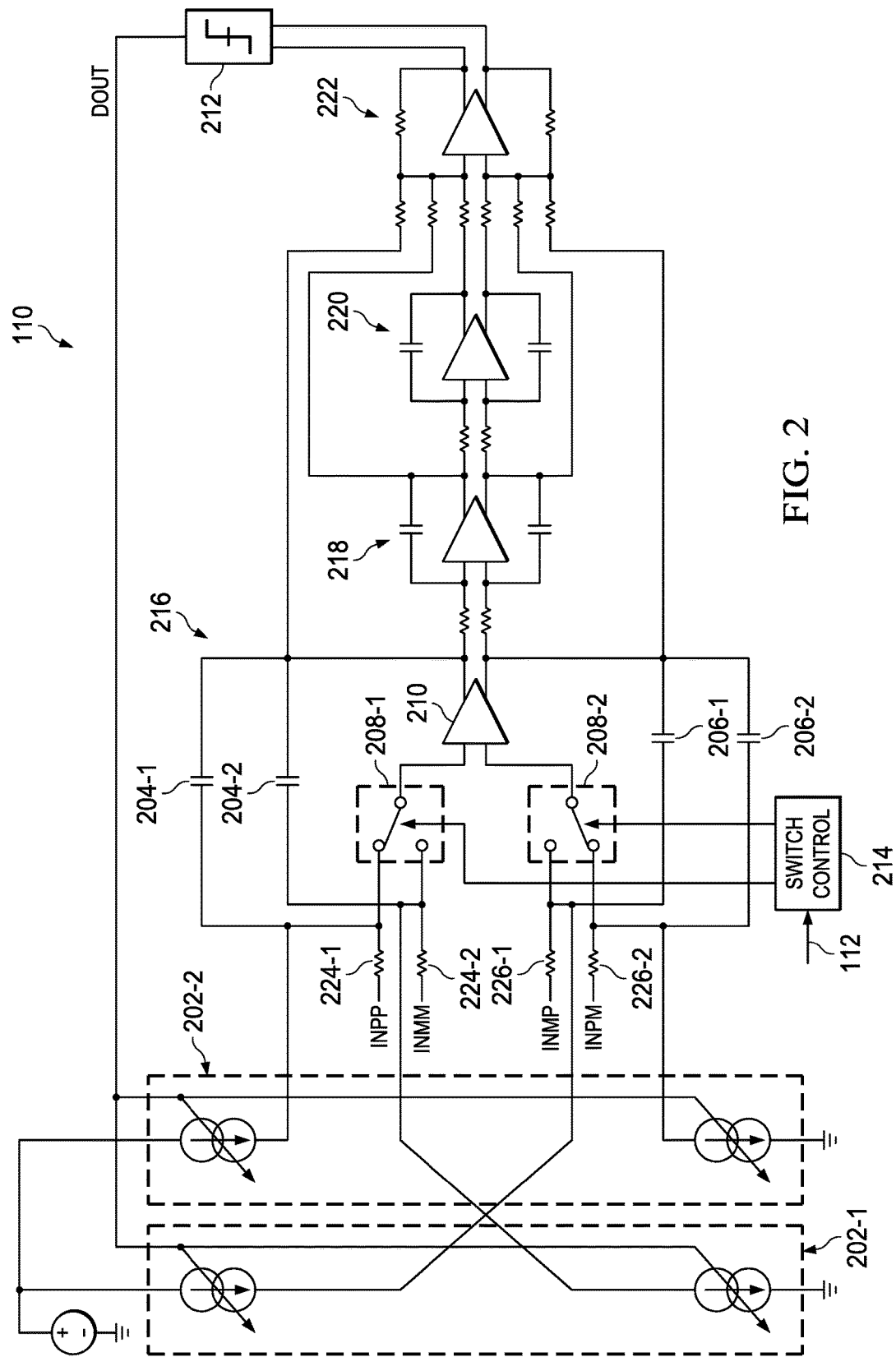
FIG. 2 shows a schematic diagram for a delta-sigma analog-to-digital converter suitable for use in a smart amplifier in accordance with various examples.

FIG. 2 shows a schematic diagram for an embodiment of the ΣΔ ADC 110. The ΣΔ ADC 110 includes DACs 202 (shown in FIG. 2 as DACs 202-1 and 202-2), switches 208 (shown in FIG. 2 as switches 208-1 and 208-2), switch control circuitry 214, integrators 216, 218, and 220, summing amplifier 222, and quantizer 212. The digital output of the quantizer 212 is provided to the two DACs 202. The DACs 202 are connected to the inputs of the switches 208, with the two signals making up the differential output of each DAC connected to different switches 208. Both of the DACs 202 are always active (i.e., always on) to eliminate the requirement for fast settling when switching from measurement of one current path (i.e., the paths of current flow through sense resistors 108) to the other. Each of the DACs 202 is dedicated to one of the current paths. For example, in the embodiment of FIG. 2, DAC 202-1 is dedicated to measurement of the current flowing in sense resistor 108-2, and DAC 202-2 is dedicated to measurement of the current flowing in sense resistor 108-1. Each DAC 202 may be trimmed to compensate for a difference in gain (e.g., mismatch between the current sense resistors 108) between the two current paths.

The integrator 216 includes a differential amplifier 210, capacitors 204 (shown in FIG. 2 as capacitors 204-1 and 204-2), capacitors 206 (shown in FIG. 2 as capacitors 206-1 and 206-2), input resistors 224 (shown in FIG. 2 as input resistors 224-1 and 224-2), and input resistors 226 (shown in FIG. 2 as input resistors 226-1 and 226-2). Thus, the integrator 210 includes two pairs of feedback capacitors and input resistors. One pair of feedback capacitors corresponding to each DAC 202 and sense resistor 108. The capacitors 204 are connected to provide feedback from a first output of the differential amplifier 210 to a first input of the differential amplifier 210. Similarly, the capacitors 206 are connected to provide feedback from a second output of the differential amplifier 210 to a second input of the differential amplifier 210. Each of the switches 208 is connected to one of the inputs of the differential amplifier 210. In the embodiment of FIG. 2, the switch 208-1 is connected to the input of the differential amplifier 210 receiving feedback via capacitors 204, and the switch 208-2 is connected to the input of the differential amplifier 210 receiving feedback via capacitors 206. Each of the terminals of the current sense resistors 108 is connected to an input terminal of one of the switches 208. One terminal of each of the sense resistors 108 is connected to a different one of the switches 208, such that in a first position of the switches 208 (the switches 208 are shown in the first position in FIG. 2) the two terminals of the sense resistor 108-1 are connected to the inputs of the differential amplifier 210, and in a second position of the switches 208 the two terminals of the sense resistor 108-2 are connected to the inputs of the differential amplifier 210. Similarly, the outputs of the DACs 202 are connected to the switches 208 such that in the first position of the switches 208 the two outputs DAC 202-2 are connected to the inputs of the differential amplifier 210, and in the second position of the switches 208 the two outputs DAC 202-1 are connected to the inputs of the differential amplifier 210.

The switch control circuit 214 controls the operation of the switches 208. The switch control circuit 214 sets the position of the switches 208 based on drive state of the drive transistors 104 and 106. At least some of the signals 112 that control the drive transistors 104 and 106, or equivalent signals, are provided to the switch control circuit 214. For example, in some embodiments, the drive signals 112-1 and 112-2 that control the low-side drive transistors 106 (or equivalents thereof) may be provided to the switch control circuit 214. If the control signals 112 indicate that drive transistor 106-1 is active and drive transistor 106-2 is inactive, then the switch control circuit 214 may set the switches 208 to connect the sense resistor 108-1 to the differential amplifier 210. If the control signals 112 indicate that drive transistor 106-2 is active and drive transistor 106-1 is inactive, then the switch control circuit 214 may set the switches 208 to connect the sense resistor 108-2 to the differential amplifier 210. If the signals 112 indicate that both drive transistors 106 are active, then the switch control circuit 214 may maintain the switches 208 in a current state (i.e., the switch control circuit 214 may not change the position of the switches 208 if both drive transistors 106 are active).

The output of the integrator 216 is further integrated by integrators 218 and 220. Some embodiments may not include the integrators 218 and 220, and the techniques disclosed herein may be used with any $\Sigma\Delta$ modulator architecture (including but not limited to feedforward architecture, feedback architectures, with or without resonators, etc.). The outputs of the integrators 216, 218, and 220 are summed by the summing amplifier 222 and provided to the quantizer 212 for generation of digital output values that are fed to the DACs 202 and the class-D amplifier control circuitry 102.

The class-D amplification system 100, including the $\Sigma\Delta$ ADC 110, provides a number of advantages over conventional smart amplifiers that include current sensing. Embodiments of the system 100 may provide significantly more accurate current measurement than conventional systems because the system 100 provides negative current sensing and is not subject to the large swings in common voltage found in conventional systems. The circuit area required to implement current sensing in the system 100 is greatly reduced relative to conventional systems because only a single $\Sigma\Delta$ ADC is employed, while conventional systems may require multiple amplifier blocks or charge pumps. The reduced common mode voltage swing provided by the system 100 also tends to reduce circuit area because fewer capacitors may be needed to accommodate the swing.

Figure 3:
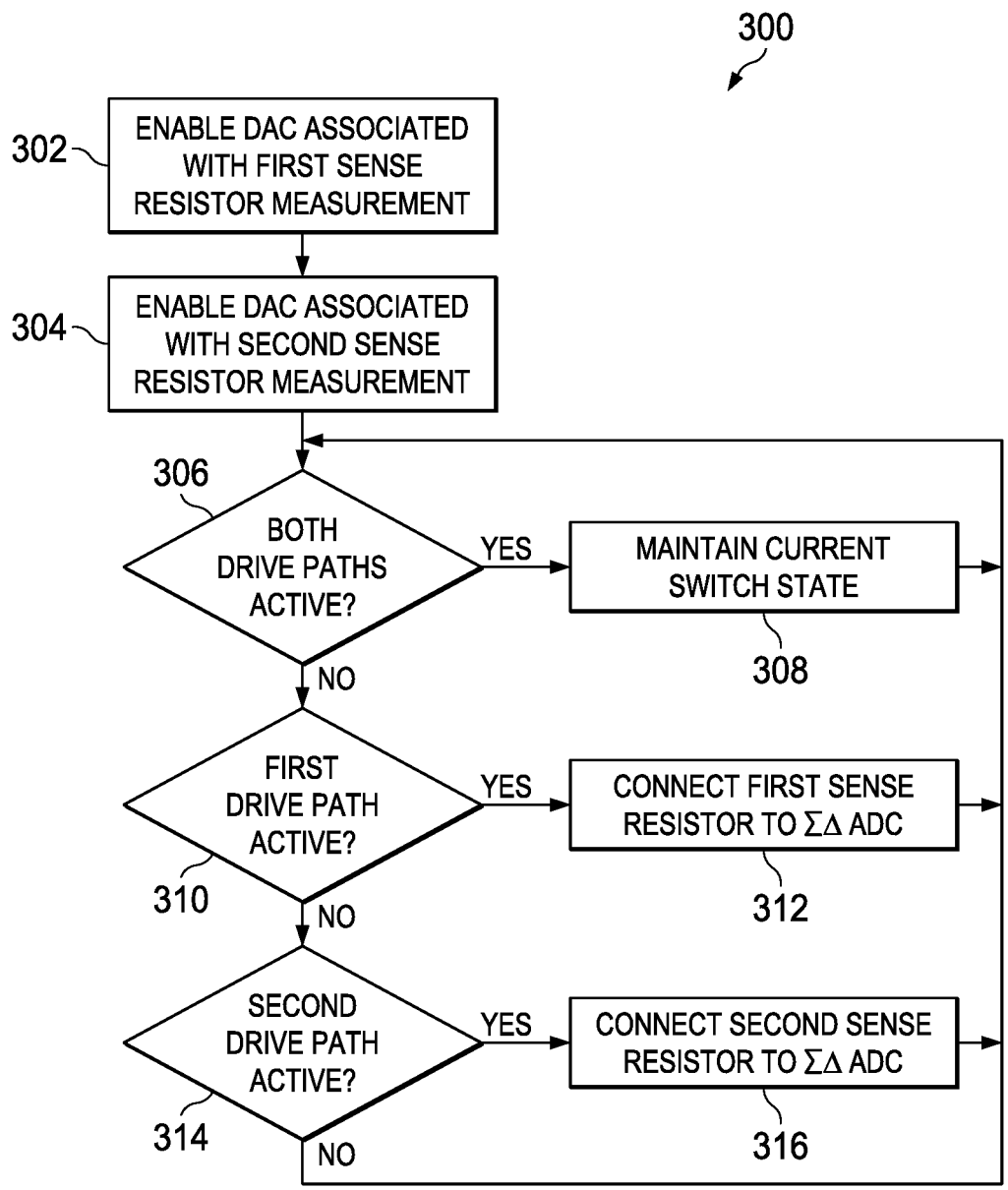
FIG. 3 shows a flow diagram for a method for measuring speaker drive current flowing from a class-D amplifier in accordance with various examples.

FIG. 3 shows flow diagram for a method 300 for measuring speaker drive current flowing from a class-D amplifier in accordance with various examples. Though depicted sequentially as a matter of convenience, at least some of the actions shown can be performed in a different order and/or performed in parallel. Additionally, some embodiments may perform only some of the actions shown. The method 300 may be performed by embodiments of the amplification system 100 that includes a $\Sigma\Delta$ ADC 110 with two DACs.

In block 302, the DAC associated with measurement of current flowing in a first current sense resistor is enabled. For example, the DAC may be DAC 202-1 of the $\Sigma\Delta$ ADC 110 that is associated with measurement of current flowing in the sense resistor 108-2. The DAC may be enabled (e.g., powered and operating) for an entire duration of operation of the amplification system 100.

In block 304, the DAC associated with measurement of current flowing in a second current sense resistor is enabled. The DAC associated with measurement of current flowing in a second current sense resistor is distinct from the DAC associated with measurement of current flowing in a first current sense resistor. For example, the DAC may be DAC 202-2 of the $\Sigma\Delta$ ADC 110 that is associated with measurement of current flowing in the sense resistor 108-1. The DAC may be enabled (e.g., powered and operating) for an entire duration of operation of the amplification system 100.

In block 306, the switch control circuit 214 is monitoring the state of the drive transistors 104 and/or 106. The switch control circuit 214 may monitor the state of the drive transistors 104 and/or 106 by monitoring the state of control signals 112. If the switch control circuit 214 determines that both speaker drive paths are active (e.g., both drive transistors 106-1 and 106-2 are turned on), then, in block 308, the switch control circuit 214 maintains the current state of the switches 208. That is, the current sense resistor 108 currently connected to the differential amplifier 210 via the switches 208 remains connected to the differential amplifier 210 while both low-side drive transistors 106 are active.

If the switch control circuit 214 determines that both speaker drive paths are not active, then, in block 310, the switch control circuit 214 determines whether a first drive path is active. For example, the switch control circuit 214 determines whether low-side drive transistor 106-2 is active. If the switch control circuit 214 determines that the first drive path is active, then the switch control circuit 214 sets the switches 208 to connect the sense resistor 108 of the first drive path to the differential amplifier 210 in block 312. For example, the switch control circuit 214 may set the switches 208 to connect the sense resistor 108-2 to the differential amplifier 210 and disconnect the sense resistor 108-1 from the differential amplifier 210.

If, in block 310, the switch control circuit 214 determines that the first drive path is not active, then, in block 314, the switch control circuit 214 determines whether a second drive path is active. For example, the switch control circuit 214 determines whether low-side drive transistor 106-1 is active. If the switch control circuit 214 determines that the second drive path is active, then the switch control circuit 214 sets the switches 208 to connect the sense resistor 108 of the second drive path to the differential amplifier 210 in block 316. For example, the switch control circuit 214 may set the switches 208 to connect the sense resistor 108-1 to the differential amplifier 210 and disconnect the sense resistor 108-2 from the differential amplifier 210.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A class-D amplifier, comprising:
   two high-side transistors and two low-side transistors connected as a bridge to drive a bridge tied speaker;
   a first sense resistor connected between a first of the low-side transistors and a low-side reference voltage;
   a second sense resistor connected between a second of the low-side transistors and the low-side reference voltage; and
   a sigma delta analog to digital converter (ΣΔ ADC) coupled to the bridge to measure voltage across the first sense resistor and the second sense resistor.

2. The class-D amplifier of claim 1, wherein the ΣΔ ADC comprises:
   a first digital to analog converter (DAC) dedicated to measurement of voltage across the first sense resistor; and
   a second DAC dedicated to measurement of voltage across the second sense resistor.

3. The class-D amplifier of claim 2, wherein the first DAC and the second DAC are trimmed to compensate for a difference between the first sense resistor and the second sense resistor.

4. The class-D amplifier of claim 2, wherein the first DAC and the second DAC are continually active while operating the class-D amplifier.

5. The class-D amplifier of claim 1, wherein the ΣΔ ADC comprises:
   a differential amplifier;
   a first switch to switchably connect one of a positive side of the first sense resistor or a negative side of the second sense resistor to a first input of the differential amplifier;
   a second switch to switchably connect one of a positive side of the second sense resistor or a negative side of the first sense resistor to a second input of the differential amplifier.

6. A speaker drive and current measurement system, comprising:
   a transistor bridge comprising:
      two high-side switching transistors;
      a first low-side switching transistor;
      a second low-side switching transistor;
      a first sense resistor that connects the first low-side switching transistor to a low-side reference voltage; and
      a second sense resistor that connects the second low-side switching transistor to the low-side reference voltage;
   a sigma delta analog to digital converter (ΣΔ ADC) coupled to the bridge, the ΣΔ ADC comprising:
      a first digital to analog converter (DAC) dedicated to measurement of voltage across the first sense resistor; and
      a second DAC dedicated to measurement of voltage across the second sense resistor.

7. The system of claim 6, wherein the ΣΔ ADC comprises:
   a differential amplifier;
   a first switch to switchably connect one of a positive side of the first sense resistor or a negative side of the second sense resistor to a first input of the differential amplifier; and
   a second switch to switchably connect one of a positive side of the second sense resistor or a negative side of the first sense resistor to a second input of the differential amplifier.

8. The system of claim 6, wherein the first DAC and the second DAC are continually active while the bridge is driving the speaker.

9. The system of claim 6, wherein the first DAC and the second DAC are trimmed to compensate for a difference between the first sense resistor and the second sense resistor.

10. An audio amplifier, comprising:
    a driver configured to drive a speaker; and
    a current monitoring system configured to measure the current output by the driver;
    wherein the driver comprises:
       two high-side transistors and two low-side transistors connected as a bridge to drive the speaker;
       a first sense resistor connected between a first of the low-side transistors and a low-side reference voltage;
       a second sense resistor connected between a second of the low-side transistors and the low-side reference voltage;
    wherein the current monitoring system comprises a sigma delta analog to digital converter (ΣΔ ADC) coupled to the driver to measure voltage across the first sense resistor and the second sense resistor, the ΣΔ ADC comprising:
       a differential amplifier;
       a first switch to switchably connect one of a positive side of the first sense resistor or a negative side of the second sense resistor to a first input of the differential amplifier;

a second switch to switchably connect one of a positive side of the second sense resistor or a negative side of the first sense resistor to a second input of the differential amplifier;
a first digital to analog converter (DAC) dedicated to measurement of voltage across the first sense resistor; and
a second DAC dedicated to measurement of voltage across the second sense resistor.

\* \* \* \* \*